United States Patent [19]
Yatsurugi

[11] Patent Number: 6,019,842
[45] Date of Patent: Feb. 1, 2000

[54] METHOD AND APPARATUS FOR LOADING RAW MATERIAL INTO A QUARTZ CRUCIBLE

[75] Inventor: Yoshifumi Yatsurugi, Fujisawa, Japan

[73] Assignee: Komatsu Electronics Metals Co., Ltd., Hiratsuka, Japan

[21] Appl. No.: 09/150,352

[22] Filed: Sep. 9, 1998

[30] Foreign Application Priority Data

Oct. 3, 1997 [JP] Japan ..................... 9-287718

[51] Int. Cl.[7] .................................................. C30B 35/00
[52] U.S. Cl. ..................... 117/214; 117/200; 117/204; 117/206; 117/900
[58] Field of Search .................... 117/200, 204, 117/206, 214, 900

[56] References Cited

U.S. PATENT DOCUMENTS

| | | | |
|---|---|---|---|
| 4,938,837 | 7/1990 | Tada et al. | 117/18 |
| 5,587,016 | 12/1996 | Altekrüger et al. | 117/214 |
| 5,868,835 | 2/1999 | Magai et al. | 117/201 |

FOREIGN PATENT DOCUMENTS

| | | |
|---|---|---|
| 43925 | of 1987 | Japan . |
| 39941 | of 1990 | Japan . |
| 208368 | of 1997 | Japan . |

*Primary Examiner*—Felisa Hiteshew
*Attorney, Agent, or Firm*—Abelman, Frayne & Schwab

[57] ABSTRACT

The process of manufacturing silicon single crystals by the CZ method is significantly improved by the present apparatus wherein raw material (polycrystalline silicon) is automatically loaded into a quartz crucible. After a protection sheet (15) is employed to cover the inner side wall of the container (3), which has an inner diameter smaller than that of the quartz crucible (10), a present amount of polycrystalline silicon (17) is loaded from the loading means (6) into the container (3). The container (3) is then filled with pure water that is thereafter frozen into an ice block (22). Subsequently, the ice block (22) is raised up from the container (3). Thereafter, the protection sheet (15) is removed from the ice block (22) and the ice block (22) is loaded into the quartz crucible (10). The ice block (22) is then caused to melt and the quartz crucible (10) and polycrystalline silicon are caused to dry up. The above operations are performed by the conveying apparatus (1).

6 Claims, 5 Drawing Sheets

METHOD AND APPARATUS FOR LOADING RAW MATERIAL INTO A QUARTZ CRUCIBLE

BACKGROUND OF THE INVENTION

1. Field of the Invention

This invention relates to a method and an apparatus for loading raw material into a quartz crucible of silicon single-crystal manufacturing devices in which the CZ method is employed.

2. Description of Prior Art

The substrates of semiconductor components are mainly made of high-purity silicon single crystal that is conventionally produced by the CZ method. In the CZ method, polycrystalline silicon lumps are fed into a quartz crucible of a single-crystal manufacturing device. Then, the quartz crucible is heated by heaters disposed therearound to melt the polycrystalline silicon lumps, after which a seed crystal installed on a seed chuck is dipped into the melted liquid. After that, the seed chuck and the quartz crucible are respectively driven to rotate in opposite or identical directions, and at the same time the seed chuck is lifted to grow a single-crystal silicon ingot of predetermined diameter and length. Furthermore, means for providing grain-shaped silicon materials are disclosed in, for example, Japanese Patent Publication Nos. 60-33210, 63-287565 and 9-208368.

Before manufacturing silicon single crystal by the CZ method, a preset amount of polycrystalline silicon has to be fed into the quartz crucible. Polycrystalline silicon is very hard and in the shape of lumps (Polycrystalline silicon chunk/Polycrystalline silicon nugget) having sharp protrusions. The quartz crucible is brittle; therefore polycrystalline silicon lumps, which is of 20–110 mm in size and reaches an amount of 90% in total volume, has to be fed into the quartz crucible one by one and by hands. Accordingly, loading polycrystalline silicon is a very simple operation yet a time-consumption procedure. Especially, following the enlargement of silicon single crystals, loading polycrystalline silicon into the quartz crucible is much more time-consumption.

SUMMARY OF THE INVENTION

In light of the above drawbacks, the object of the present invention is to provide a method and an apparatus capable of rapidly loading polycrystalline silicon lumps (raw material) into a quartz crucible with less hand-operation and avoiding damage of the quartz crucible in the process of manufacturing silicon single-crystal employing the CZ method.

To achieve the above object, a first apparatus according to this invention, for loading raw material into a quartz crucible is used for loading polycrystalline silicon into a quartz crucible before manufacturing silicon single crystal by the CZ method, which is characterized in that: it comprises a container having an inner diameter smaller than that of the quartz crucible; means for loading polycrystalline silicon lumps into the container; means for pouring pure water into the container; means for freezing the water poured into the container; means for taking out the ice block made of polycrystalline silicon lumps and pure water from the container and loading it into the quartz crucible; means for melting the ice block loaded into the quartz crucible; and means for drying the quartz crucible and polycrystalline silicon lumps loaded thereinto.

According to the above structure, it is possible to produce an ice block consisting of polycrystalline silicon lumps and pure water (De Ionized Water) and with a diameter smaller than that of the quartz crucible. Therefore, a preset amount of polycrystalline silicon can be fed into the quartz crucible by shifting the ice block from the container to the quartz crucible. The ice block containing polycrystalline silicon lumps is fed into the quartz crucible as it is; therefore impacts will not impose on the quartz crucible. Contamination substance stuck on polycrystalline silicon lumps during the process prior to feeding of the silicon lumps will be washed off by pure water. Furthermore, after melting the ice block fed into the quartz crucible and drying the quartz crucible and polycrystalline silicon lumps, they are ready for being transported into single-crystal manufacturing equipment.

Furthermore, a second apparatus according to this invention, for loading raw material into a quartz crucible is characterized in that: means for coating a protection sheet covering on the inner side wall of the container is provided in the first apparatus for loading raw material into the quartz crucible.

According to the above structure, a protection sheet is covering on the outer periphery of the ice block; therefore it is easy to take the ice block out from the container. Furthermore, friction between the polycrystalline silicon lumps and the inner wall of the container can be avoided, and impurities produced along with the damage of the inner wall of the container can be evaded.

Furthermore, the third apparatus for loading raw material into the quartz crucible is characterized in that: in the above first and second apparatuses for loading raw material into the quartz crucible; the container, the means for loading polycrystalline silicon lumps into the container, and the protection sheet are made of materials with their specific gravity less than 1, for example semiconductor-use polyethylene resin.

If the container used for loading polycrystalline silicon lumps, the means for loading polycrystalline silicon lumps into the container, the protection sheet covering the inner side wall of the container, or at least one of them collide with polycrystalline silicon lumps during operation; then the debris broken off from them will drop down and enter the container. The above debris will float up and flow out of the container when pure water is poured into the container. Therefore, the debris will not enter the melting liquid.

The fourth apparatus for loading raw material into the quartz crucible is characterized in that: in the above first apparatus for loading raw material into the quartz crucible; means for rotating the container during loading polycrystalline silicon lumps and means for repeatedly moving the loading means upward/downward and back/forth horizontally within a certain extent are provided.

During loading polycrystalline silicon lumps into the container, the loading means is lowered to a proper height and is moved back/forth horizontally, and simultaneously the container is rotated. Therefore, polycrystalline silicon lumps can be densely loaded as if performed by hands. Furthermore, the uneven distributed performance of operation can be reduced and reduction of manual operation can be achieved, if the above-described means is employed.

The fifth apparatus for loading raw material into the quartz crucible is characterized in that: in the above second apparatus for loading raw material into the quartz crucible; in stead of the covering means that is the protection sheet covering the inner side wall of the container, a covering means, for example an ice basket produced by spraying pure water on the whole inside wall of the container, is provided.

According to the above apparatus for loading raw material into the quartz crucible, the whole inside wall of the container is protected by the ice basket during loading polycrystalline silicon lumps. Furthermore, polycrystalline silicon lumps is covered by ice which is the ice basket and the ice block made of pure water poured into the container. Therefore, polycrystalline silicon lumps can be loaded into the quartz crucible without being exposed to the air even if the ice block begins melting. Other structures are the same as those of the first apparatus for loading raw material into the quartz crucible, the same functions are also provided.

Next, the first method for loading raw material into a quartz crucible is characterized in that: before manufacturing silicon single crystal by the CZ method, in the process of loading polycrystalline silicon lumps into the quartz crucible, a preset amount of polycrystalline silicon is loaded into a container other than the quartz crucible; then the container is filled with pure water that is thereafter frozen into an ice block; subsequently one or plural ice blocks made of polycrystalline silicon and pure water are taken out from the container and loaded into the quartz crucible; thereafter the ice blocks are made to melt and the quartz crucible and polycrystalline silicon are directed to dry up.

According to the above, instead of directly loading into the quartz crucible, polycrystalline silicon is loaded into a container having the same inner diameter as that of the quartz crucible. After filling the container with pure water, the pure water is frozen into an ice block. The ice block containing polycrystalline silicon is loaded into the quartz crucible, therefore polycrystalline silicon debris produced in the process of loading raw materials will not impact the inner wall of the quartz crucible. Thus, damages of the quartz crucible incurred during loading raw materials can be avoided. An ice block containing polycrystalline silicon can be divided into plural ones so as to agree with the amount of the raw material to be fed into the crucible.

The second method for loading raw material into a quartz crucible is characterized in that: in the process of loading polycrystalline silicon lumps into the quartz crucible of the first method, a protection sheet is used to cover the inner side wall of the container and a preset amount of polycrystalline silicon is loaded into the container; then the container is filled with pure water that is thereafter frozen into an ice block; subsequently the ice block is taken out from the container; thereafter the protection sheet is taken away from the ice block made of polycrystalline silicon and pure water and the ice block is loaded into the quartz crucible. Damages of the container incurred by impact of polycrystalline silicon lumps can be avoided by covering a protection sheet on the inner side wall of the container. Furthermore, during taking polycrystalline silicon lumps out from the container, the friction between polycrystalline silicon lumps and the container can be evaded. Therefore, abrasion powders of the container will not mixed into the raw material.

The third method for loading raw material into a quartz crucible is characterized in that: in the process of loading polycrystalline silicon lumps into the quartz crucible of the first method; a preset amount of polycrystalline silicon is loaded into the container after inserting an ice basket into the container; then the container is filled with pure water that is thereafter frozen into an ice block; subsequently the ice block is taken out from the container; thereafter the ice block made of polycrystalline silicon and pure water is loaded into the quartz crucible. According to the above method, polycrystalline silicon lumps is covered by ice which is the ice basket and the ice block made of pure water poured into the container. Therefore, polycrystalline silicon lumps can be loaded into the quartz crucible without damaging the container and the quartz crucible. Furthermore, even that the outer surface of the ice block begins to melt, polycrystalline silicon lumps will not drop out from the ice block. Therefore, loading of the raw material into the quartz crucible can be performed smoothly.

BRIEF DESCRIPTION OF THE DRAWINGS

The present invention can be more fully understood by reading the subsequent detailed description and examples with reference made to the accompanying drawings, wherein.

DETAILED DESCRIPTION OF THE PREFERRED EMBODIMENTS

Figure 1:
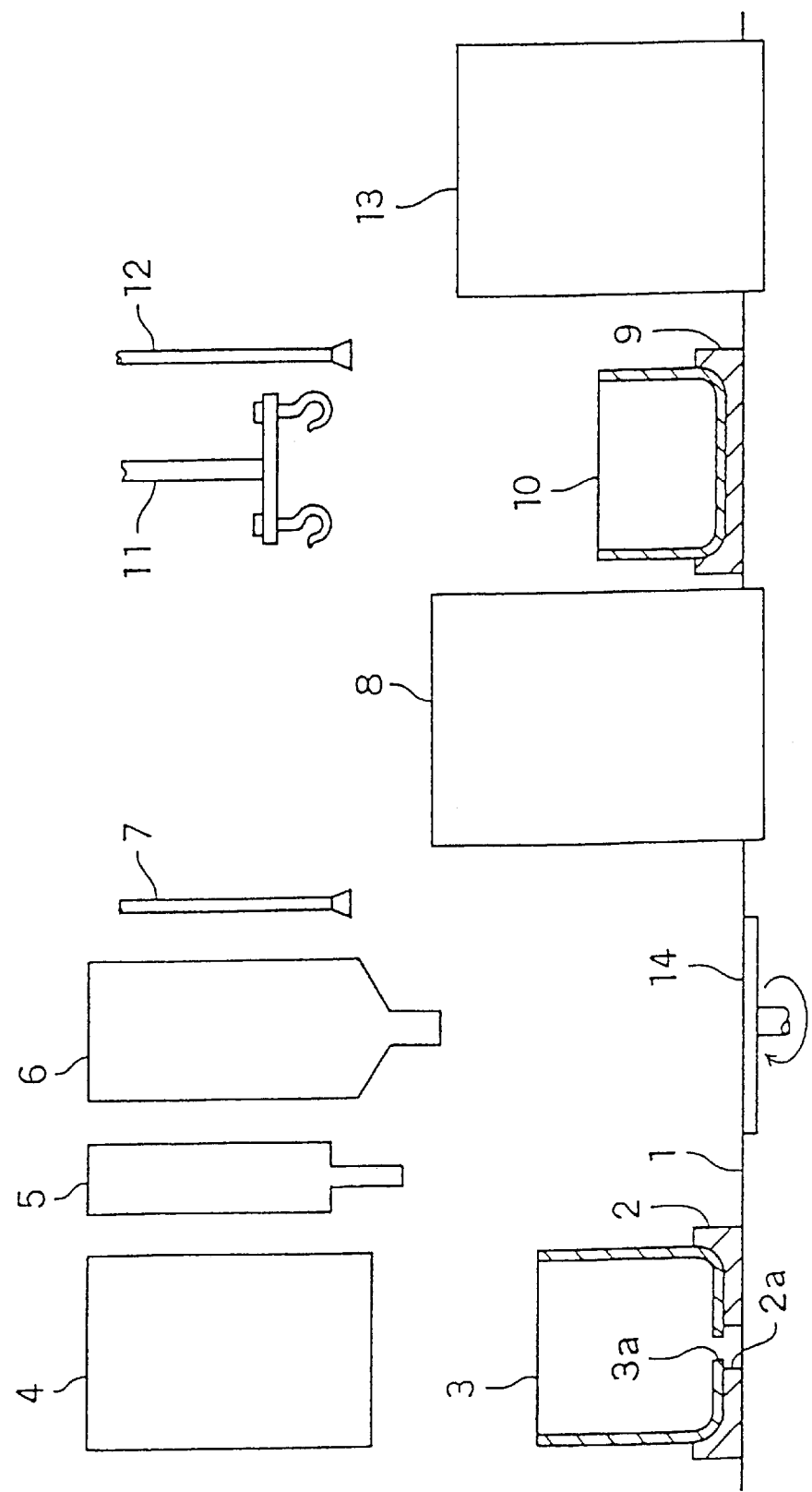
FIG. 1 is a schematic illustration showing an installation for loading raw material into a quartz crucible according to the first embodiment.

The following is a description of an embodiment of the method and the device for loading raw material into a quartz crucible according to this invention, with references being made to the accompanying drawings. The primary installation constructing the first embodiment of the raw material loading device is shown in FIG. 1. The installation shown in FIG. 1 is enumerated as an example, the inter-spaces required between equipment has to be taken into consideration.

A container 3 is placed on a conveying device 1 via a support base 2. A protection sheet supplying apparatus 4, a silicon pipe supplying apparatus 5, a raw material supplying apparatus 6, a water-supplying pipe 7 are installed above the conveying device 1 in a sequential manner and each can descend and ascend without any restraint. A freezing device 8 is installed on the conveying device 1, which is located on the downstream side of the water-supplying pipe 7. A quartz crucible 10 is disposed on the conveying device 1, which is located on the downstream side of the freezing device 8, via a support base 9. An automatic ascending/descending apparatus (not shown) having a suspension tool 11 and a water-dispersion pipe 12 capable of ascending or descending freely are installed above the quartz crucible 10. A drying apparatus 13 such as the microwave oven or the hot-air dryer is disposed at the most downstream site of the conveying device 1. A turntable 14 is disposed on the conveying device 1 and is located below the raw material supplying apparatus 6. The container 3 conveyed by the turntable 14 can be rotated together with the turntable 14. The raw material supplying apparatus 6 is capable of moving in the horizontal direction reciprocally within some extent and in synchronization with the rotating motion of the turntable 14. Furthermore, a drain pump (not shown) is installed at a site directly below the water-dispersion pipe 12.

Figure 2:
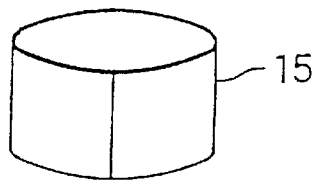
FIG. 2 is a perspective view showing the structure of a protection sheet.

The inner diameter of the container 3 is the same as or smaller than that of the quartz crucible 10. Preferably, the inner diameter of the container 3 is somewhat smaller than that of the quartz crucible 10 and the depth of the container 3 is larger than that of the quartz crucible 10. A drain hole 3a is formed in the bottom surface of the container 3, and a drain hole 2a larger than the drain hole 3a is formed in the bottom surface of the support base 2. The protection sheet supplying apparatus 4 is used for inserting protection sheets 15 shown in FIG. 2 into the container 3. The protection sheets 15, used for sticking on the inner side wall of the container 3, are in the rectangular shape and wrapped into cylinders.

The container 3, the protection sheet 15, and at least the lower end of the raw material supplying apparatus 6 are made of high purity resin whose density is lower than water. Furthermore, the raw material stored in the raw material supplying apparatus 6 is a mixture of polycrystalline silicones which are in shapes such as lumps, craps, and grains. The water-supplying pipe 7 and the water-dispersion pipe 12 are used for discharging pure water. A not shown control device automatically controls the above installation.

As above described, the installation used for loading raw material is arranged in a sequential manner in correspondence with operational proceedings. By controlling the above installation in an automatic manner, manual operations can be distinctively reduced. Consequently, laborsaving can be achieved.

The steps for loading raw material by employing the above installation are as follows.

(1) The container 3 installed on the support base 2 of FIG. 1 is conveyed to a location below the protection sheet supplying apparatus 4, then the protection sheet supplying apparatus 4 descends and inserts a protection sheet 15 into the container 3. The protection sheet 15 is directed to cover and stick to the inner side wall of the container 3, then the protection sheet supplying apparatus 4 ascends to its original location.

(2) The container 3 is conveyed to a location below the silicon pipe supplying apparatus 5, then the silicon pipe supplying apparatus 5 descends and discharges an water-draining pipe 16. The water-draining pipe 16 is used for draining water in the subsequent proceedings and is preferably made of single-crystal silicon or polycrystalline silicon of the same purity as that of the polycrystalline silicon used as the raw material of single-crystal silicon. The water-draining pipe 16 is arranged to lean against the wall of the container 3. Subsequently, the silicon pipe supplying apparatus 5 ascends to its original location.

Figure 3:
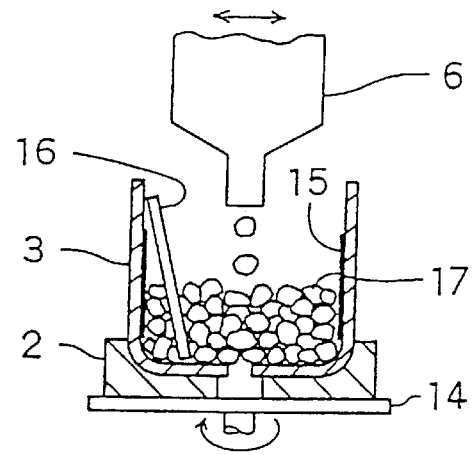
FIG. 3 is a schematic illustration showing the state of loading raw material into a container.

(3) As shown in FIG. 3, the container 3 is conveyed onto the turntable 14 below the raw material supplying apparatus 6, then the raw material supplying apparatus 6 descends and loads a preset amount of polycrystalline silicon 17 into the container 3. At this moment, the container 3 is rotated together with the turntable 14 and the raw material supplying apparatus 6 moves in the horizontal direction reciprocally. Therefore, polycrystalline silicon 17 drops into the container 3 in an evenly distributed way and can be tightly packed into the container 3 as if by hands.

Figure 4:
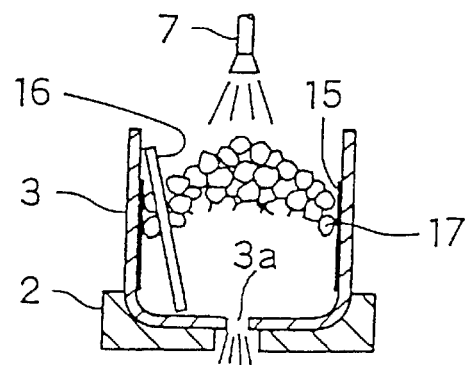
FIG. 4 is a schematic illustration showing the state of cleaning the polycrystalline silicon lumps loaded into a container.

(4) The container 3 packed with the polycrystalline silicon 17 is conveyed to a location below the water-supplying pipe 7. As shown in FIG. 4, the polycrystalline silicon 17 is washed by pure water discharged from the water-supplying pipe 7. Contamination substance stuck on the polycrystalline silicon 17, the container 3, and the protection sheet 15 is washed off by pure water which is drained from the draining hole 3a formed in the bottom of the container 3.

(5) The draining hole 3a is blocked and the container 3 is filled with pure water discharged from the water-supplying pipe 7 until its upper rim.

Figure 5:
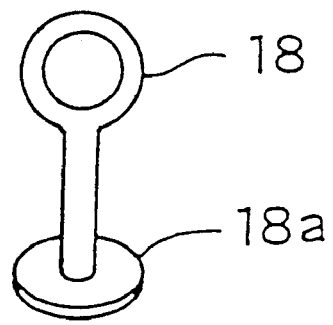
FIG. 5 is a perspective view showing the structure of a suspension ring.
Figure 6:
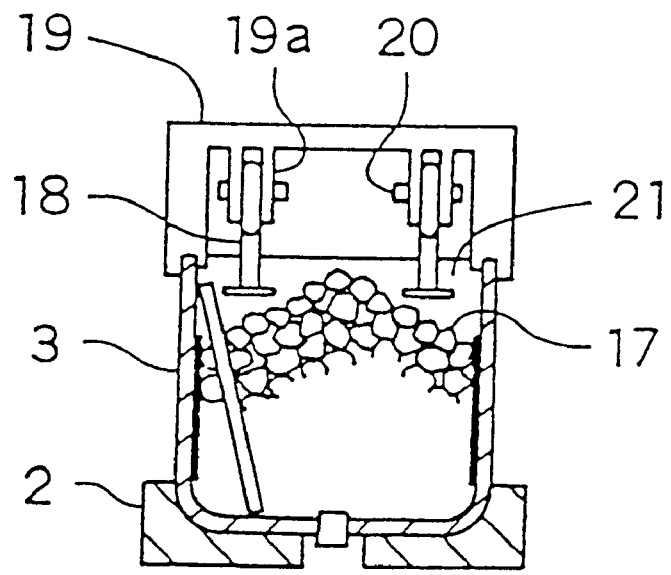
FIG. 6 is a schematic illustration showing the state of the container before the freezing process.

(6) A plurality of suspension rings are suspended at a suspension holder. The suspension rings are engaging with the upper rim of the container 3. As shown in FIG. 5, a drop-prevention plate 18a is provided at the lower end of the suspension ring 18. Furthermore, as shown in FIG. 6, the suspension holder 19 upholds the suspension rings 18 clamped by the brackets 19a with the aid of the pins 20. In the event that the suspension holder 19 engages with the upper rim of the container 3, the lower end portions of the suspension rings 18 dip into pure water.

(7) The container 3 is conveyed into the freezing device 8, and the container 3 is frozen progressively from its lower portion. The protection sheet 15, the polycrystalline silicon 17, the suspension rings 18, and the pure water are frozen together and turn into one block.

(8) The container 3 is conveyed out of the freezing device 8, and the suspension holder 19 is released from the suspension rings 18. At the time the container 3 is conveyed to a location below the suspension tool 11 of the automatic ascending/descending apparatus, the suspension tool 11 descends and engages with the suspension rings 18. Then, the outer surface of the container 3 is warmed up by warm wind. After that, the suspension tool 11 is raised up to detach the ice block 22 containing polycrystalline silicon from the container 3. Then, the protection sheet 15 is ripped off from the raised ice block 22.

Figure 7:
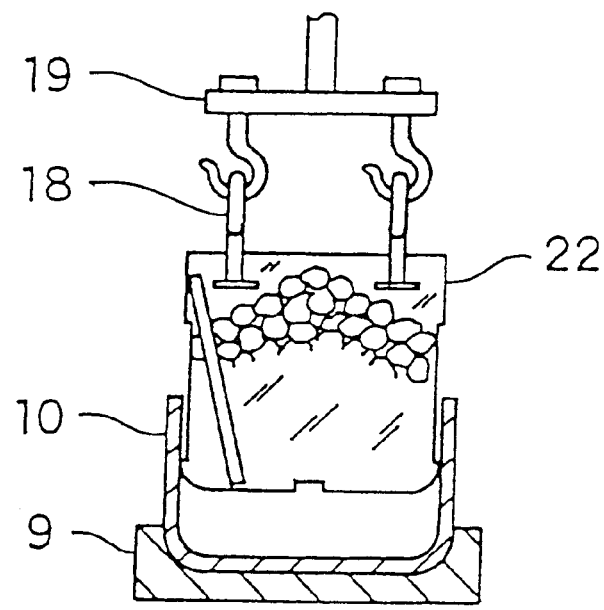
FIG. 7 is a schematic illustration showing the state before loading the ice block containing polycrystalline silicon lumps into the quartz crucible.

(9) As shown in FIG. 7, the quartz crucible 10 is conveyed below the raised ice block 22 containing polycrystalline silicon, then the ice block 22 containing polycrystalline silicon is lowered to load into the quartz crucible 10 by the actuation of the automatic ascending/descending apparatus. Subsequently, the suspension tool 11 disengaged with the suspension rings 18 ascends to its original location.

Figure 8:
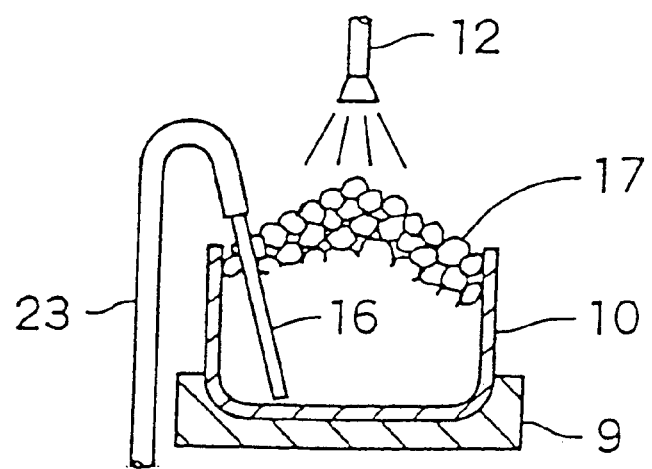
FIG. 8 is a schematic illustration showing the state of cleaning the polycrystalline silicon lumps loaded into the quartz crucible.

(10) The quartz crucible 10 is conveyed to a location below the water-dispersion pipe 12. As shown in FIG. 8, one end portion of a drain hose 23 is directed to connect to one end portion of the water-draining pipe 16. The other end portion of the drain hose 23 is connected to a not shown draining pump. Then, the water-dispersion pipe 12 descends to pour pure water onto the ice block 22 containing polycrystalline silicon so as to melt it. In the process of melting, the suspension rings 18 shown in FIG. 7 are taken away and exposed polycrystalline silicon 17 is washed. After that, the draining pump is actuated to drain out pure water from the quartz crucible 10. After draining, the water-draining pipe 16 is drawn out from the quartz crucible 10. The water-draining pipe 16 is made of polycrystalline silicon or single-crystal silicon. Thus, at the time the water-draining pipe 16 breaks or the water-draining pipe 16 is unable to draw out from the quartz crucible 10 due to seizing by the polycrystalline silicon 17, the water-draining pipe 16 can be left in the quartz crucible 10 without imposing any bad affect on the produced single crystals.

(11) The quartz crucible 10 is conveyed into the drying apparatus 13, and the polycrystalline silicon 17 and the quartz crucible 10 are brought to dry out.

(12) Then, the quartz crucible 10 is conveyed to a preset location near the single-crystal manufacturing device.

In the above embodiment, proceedings of all steps and shifting from one step to the succeeding step can be arranged to perform automatically.

It is also acceptable to divide the polycrystalline silicon into, for example, two parts, if the amount of the polycrystalline silicon to be loaded into the quartz crucible is huge. Namely, one is for loading into the lower portion of the quartz crucible and the other one is for loading into the upper portion of the quartz crucible. The two parts of the polycrystalline silicon together with pure water are respectively frozen into ice blocks and loaded into the quartz crucible in order. Furthermore, the above ice blocks can also be produced in large quantities and stored in a refrigerator. This can perform loading of the raw material into the quartz crucible in an efficient manner.

According to the above method, it is needless to load the polycrystalline silicon directly into the quartz crucible as conventionally. Raw material loaded into the container is frozen, together with pure water, into ice block and is loaded into the quartz crucible as it is. Therefore, impact will not be imposed on the quartz crucible and the required raw material can be loaded at one single time. Furthermore, the raw material is washed twice by pure water respectively after being loaded into the container and during the melting of the ice block loaded into the quartz crucible. Therefore, it is fed into the single-crystal manufacturing device in a state of being clean.

In the raw material loading device of the second embodiment; the whole equipment, including those from the protection sheet supplying apparatus 4 to the automatic ascending/descending apparatus used for raising or lowering the suspension tool 11 (see FIG. 1), is installed within a freezing room. If it is not the case, at least the freezing device 8 and the automatic ascending/descending apparatus used for raising or lowering the suspension tool 11 have to be installed in a freezing room. Employing such a raw material loading device, the polycrystalline silicon will not drop off from an ice block during the process of shifting the ice block containing polycrystalline silicon from the container 3 to the quartz crucible 10. Furthermore, due to the protection sheet, exposed crests of the polycrystalline silicon lumps will not scratch the inner wall of the quartz crucible 10.

Figure 9:
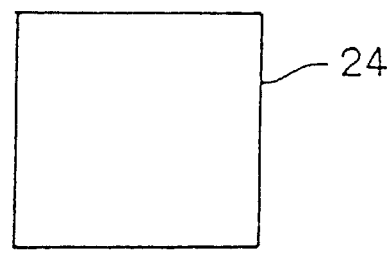
FIG. 9 is a schematic illustration showing the state of loading an ice basket into a container according to the third embodiment of the raw material loading device.
Figure 9:
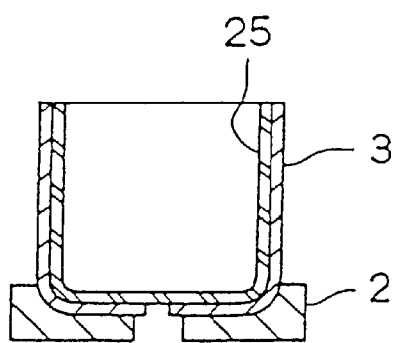

In the raw material loading device of the third embodiment, instead of the protection sheet supplying apparatus, an ice-basket supplying apparatus 24 is installed at a location above the utmost upstream site of the conveying device 1 (see FIG. 9). The ice-basket supplying apparatus 24 is used for inserting the ice basket 25 made of pure water into the container 3. The ice basket 25 is a container with a preset thickness. The outer diameter is somewhat smaller than the inner diameter of the container 3, and its height is substantially the same as that of the container 3. Other apparatuses are the same as those of the first embodiment. Furthermore, in FIG. 9, it is also satisfactory to omit the drain hole 2a of the support base 2 and the drain hole 3a of the container 3.

In the event of employing the raw material loading device of the third embodiment, the container 3 disposed on the support base 2 is conveyed below the ice-basket supplying apparatus 24. Then, the ice-basket supplying apparatus 24 descends to insert an ice basket 25 into the container 3 (see FIG. 9). The subsequent processes are the same as those of the first embodiment. However, to restrain the melting of the ice basket 25 to its minimum value after the loading of the polycrystalline silicon, the ice basket 25 is filled with pure water only. The container 3 is directly conveyed into the freezing device without washing off the polycrystalline silicon. If the whole equipment is installed within a freezing room, then it is possible to wash off the polycrystalline silicon as the first embodiment of loading raw material after loading the polycrystalline silicon into the ice basket 25. The above whole equipment includes those from the ice-basket supplying apparatus 24 to the automatic ascending/descending apparatus used for raising or lowering the suspension tool 11 (see FIG. 1).

Figure 10:
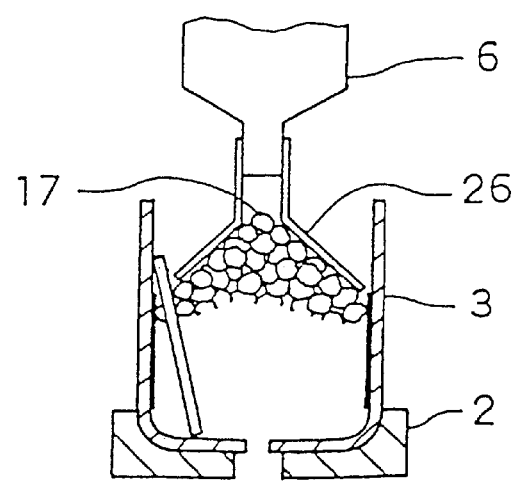
FIG. 10 is a schematic illustration showing the method for loading the raw material at the last stage of loading operation.

In order to load a preset amount of polycrystalline silicon into the quartz crucible, polycrystalline silicon is piled up into a cone shape at the last stage of loading operation. The method described hereinafter for loading raw material is used for expediently performing the above operation. At the last stage of loading polycrystalline silicon from the raw material supplying apparatus 6 into the container 3, the reciprocal movement of the raw material supplying apparatus 6 is stopped and the raw material supplying apparatus 6 is paused at the central position of the container 3. As shown in FIG. 10, a fixture 26 in the shape of cone and made of the same material is installed at the lower end of the raw material supplying apparatus 6. Then, the location of the raw material supplying apparatus 6 is adjusted so as to bring the lower end of the fixture 26 to approach the upper end of the container 3. Under such a circumstance, the loaded polycrystalline silicon 17 is piled up into a shape similar to that of the fixture 26, and loading of polycrystalline silicon is accomplished.

The amount of polycrystalline silicon piled in the shape of a cone at the last stage of the loading operation can be increased or reduced by changing the cone angle of the fixture 26. The depth of the container 3 is determined by the height of the piled raw material. The utmost portion of the raw material shown in FIG. 10 is considered as a hide depth.

According to the above described, the following effects can be obtained.

(1) Conventionally, loading raw material into the quartz crucible was a hand-operated and time-consuming work. Laborsaving and fast operations can be achieved by employing a raw material loading device, which is a combination of simple-structure apparatuses. In particular, a container is used for preliminary loading of raw material, therefore breaking of the quartz crucible can be avoided and it is easy to perform loading by machines.

(2) Polycrystalline silicon is frozen together with pure water into ice blocks that are thereafter loaded into the quartz crucible. Therefore, there is no restriction to the shapes and the sizes of polycrystalline silicon, and it is possible to handle an amount of polycrystalline silicon weighing from several 10 Kilograms to 1 ton.

(3) Polycrystalline silicon is washed with pure water for two times, respectively after loading into the container and after loading into the quartz crucible. Contamination substance stuck on polycrystalline silicon lumps is thus removed and the quality of silicon single crystals lifted can be enhanced.

(4) In conclusion, notable advantages can be obtained in manufacturing silicon single crystals with large diameter.

What is claimed is:

1. A device for loading raw material into a quartz crucible, which is used for loading polycrystalline silicon into a quartz crucible before manufacturing silicon single crystal by the CZ method, comprising a container (3) having an inner diameter smaller than that of the quartz crucible (10);

means (6) for loading polycrystalline silicon lumps (17) into the container (3);

means (7) for pouring pure water into the container (3);

means (8) for freezing the water poured into the container (3);

means for taking out the ice block (22) made of polycrystalline silicon lumps (17) and pure water from the container (3) and loading it into the quartz crucible (10);

means for melting the ice block (22) loaded into the quartz crucible (10); and means (13) for drying the quartz crucible (10) and polycrystalline silicon lumps (17) loaded thereinto.

2. A device for loading raw material into a quartz crucible as claimed in claim 1, wherein means (4) for coating a protection sheet (15) covering on an inner side wall of the container (3) is provided.

3. A device for loading raw material into a quartz crucible as claimed in claim 1, wherein the container (3), the means (6) for loading polycrystalline silicon lumps (17), and the protection sheets (15) are made of materials having a specific gravity less than 1.

4. A device for loading raw material into a quartz crucible as claimed in claim 2, wherein the container (3), the means (6) for loading polycrystalline silicon lumps (17), and the protection sheets (15) are made of materials with their specific gravity less than 1.

5. A device for loading raw material into a quartz crucible as claimed in claim 1, wherein means (14) for rotating the container (3) during loading polycrystalline silicon lumps and means for repeatedly moving the loading means (6) upward/downward and back/forth horizontally within a certain extent are provided.

6. A device for loading raw material into a quartz crucible as claimed in claim 2, wherein in stead of the covering means that is the protection sheet (15) covering the inner side wall of the container (3), a covering means (24) that is an ice basket (25) covering the whole inside wall of the container(3) is provided.

* * * * *